(12) United States Patent
Lei

(10) Patent No.: US 12,197,173 B2
(45) Date of Patent: Jan. 14, 2025

(54) DRIVE CIRCUIT AND DRIVE METHOD

(71) Applicant: Ningbo ABAX Sensing Electronic Technology Co., Ltd., Ningbo (CN)

(72) Inventor: Shuyu Lei, Ningbo (CN)

(73) Assignee: Ningbo ABAX Sensing Electronic Technology Co., Ltd., Ningbo (CN)

( * ) Notice: Subject to any disclaimer, the term of this patent is extended or adjusted under 35 U.S.C. 154(b) by 205 days.

(21) Appl. No.: 18/042,751

(22) PCT Filed: Dec. 15, 2020

(86) PCT No.: PCT/CN2020/136586
§ 371 (c)(1),
(2) Date: Feb. 23, 2023

(87) PCT Pub. No.: WO2022/041582
PCT Pub. Date: Mar. 3, 2022

(65) Prior Publication Data
US 2023/0297034 A1    Sep. 21, 2023

(30) Foreign Application Priority Data

Aug. 31, 2020  (CN) .......................... 202010895358.0
Aug. 31, 2020  (CN) .......................... 202010895674.8

(51) Int. Cl.
*G04F 10/00*   (2006.01)
*H03K 19/21*   (2006.01)
(Continued)

(52) U.S. Cl.
CPC ........... *G04F 10/005* (2013.01); *H03K 19/21* (2013.01); *H03M 1/10* (2013.01); *H03M 1/50* (2013.01)

(58) Field of Classification Search
CPC ........ G04F 10/005; H03K 19/21; H03M 1/10; H03M 1/50
See application file for complete search history.

(56) References Cited

U.S. PATENT DOCUMENTS

2003/0076251 A1    4/2003 Gupta et al.

FOREIGN PATENT DOCUMENTS

CN        201795819 U       4/2011
CN        103825612 A  *    5/2014   .............. H03M 1/10
(Continued)

OTHER PUBLICATIONS

International Search Report, China National Intellectual Property Administration, Application No. PCT/CN2020/136586, mailed May 26, 2021, 4 pages.

*Primary Examiner* — Joseph J Lauture
(74) *Attorney, Agent, or Firm* — Ziegler IP Law Group LLC.

(57) ABSTRACT

A drive circuit, comprising: a target waveform conversion part, configured to convert target waveform information into a current or voltage signal, and output the converted current or voltage signal to a first sampling circuit and a second sampling circuit; a computational module, the computational module outputting an action command on the basis of the output results of the first sampling circuit and the second sampling circuit; and a TDC module for outputting time parameters of a counting interval on the basis of the action command outputted by the computational module. By means of the present circuit, time information of a predetermined interval can be automatically acquired, for example time information of a rising edge or a falling edge, and can then be used to calibrate emission or calibrate the final ranging result of a time-of-flight ranging solution, such that the emitted light waveform of an emission source is more accurate or the ranging result is more accurate.

20 Claims, 6 Drawing Sheets

(51) Int. Cl.
*H03M 1/10* (2006.01)
*H03M 1/50* (2006.01)

(56) References Cited

FOREIGN PATENT DOCUMENTS

| CN | 110708047 A | 1/2020 |
| CN | 111474571 A | 7/2020 |

\* cited by examiner

DRIVE CIRCUIT AND DRIVE METHOD

The present application is the national phase of PCT International Application No. PCT/CN2020/136586, which claims priorities to Chinese Patent Application No. CN202010895674.8, titled "DRIVE CIRCUIT AND DRIVE METHOD", and Chinese Patent Application No. CN202010895358.0, titled "DRIVE CIRCUIT AND METHOD" filed on Aug. 31, 2020 with the Chinese Patent Office, all of which are incorporated herein by reference in their entireties.

FIELD

The present disclosure relates to the field of drive circuits, and specifically to a drive circuit and a drive method.

BACKGROUND

The rising/falling time of a signal propagating between the CPU and the chipset typically vary due to one or more external influences, including: a process on a large number of dies, a variation in the silicon strength caused by the voltage and/or temperature. Further, the uncompensated supply voltage variation may cause the variation of the rising/falling time. These variations have a detrimental effect on the system performance. For example, if the rising/falling time is too slow, a timing failure may occur. In addition, if the rising/falling time is too fast, a signal integrity and reliability problem may occur due to a large reflection and an overshoot/undershoot effect. For a detection system having an active light source, such as a ranging system with the laser as a light source, driving the laser source to emit a specific waveform is critical to the detection, and the accuracy of the waveform depends on the accurate control for the rising time and the falling time to a great extent.

The rising time is a time required for a digital logic circuit to switch from a low logic level to a high logic level (e.g., from "0" to "1"), and the falling time is a time required for the digital logic circuit to switch from a high logic level to a low logic level (e.g., from "1" to "0"). Determining whether the rising and falling times (a rising edge and a falling edge) of the pulse are within a specified range is fundamental to the use of the pulse in measurement and test applications. The degree to which the rising and/or falling times of the pulse affect the desired device under test performance depends on the nature of the device and the type of test to be performed.

Most pulse generators do not have the function of separate self-contained verification for the rising time and the falling time, and do not have the function of separate self-contained adjustment for the rising time and the falling time. Such devices typically require the use of an external oscilloscope and an automatic test equipment controller or a trained operator to perform the verification for the rising time and the falling time of the pulse.

In the above solution, an oscilloscope (having an additional cost) and an automated test controller (a dedicated computer and software) or a trained operator are required. Further, the operation of the circuit at the rising and falling times may be affected by an operating temperature or component aging, and may require continuous or frequent calibration. If relatively complex measurements or procedures are required to adjust for these effects, users may find the adjustments inconvenient and operate the instrument under less than ideal conditions.

In addition, in the TOF ranging process, the distance to the detected object determined by using the time of flight has some deviation due to the presence of the rising time and the falling time, and a method by which the rising time and the falling time can be obtained is needed in order to obtain more accurate detection results.

In order to solve the above problems, it is urgently to provide a circuit and a method by which the exact operating waveform of the driven light source can be quickly and accurately determined to achieve accurate detection, and a laser emitter that can be integrated with the emitter driver to achieve self-detection and calibration.

SUMMARY

An object of the present disclosure is to provide a drive circuit and a drive method for the above-mentioned deficiencies in the conventional technology, to solve the problem the waveform at the emitting end cannot be precisely controlled or the ranging result cannot be more accurately outputted.

In order to achieve the above object, technical solutions in the embodiments of the present disclosure are provided as follows.

In a first aspect, a drive circuit is provided according to an embodiment of the present disclosure. The drive circuit includes: a target waveform conversion portion, an operation module and a TDC module, where the target waveform conversion portion is configured to convert target waveform information into a current or voltage signal, where the current or voltage signal obtained by conversion is outputted to a first sampling circuit and a second sampling circuit;

the operation module is configured to output an action instruction in accordance with output results of the first sampling circuit and the second sampling circuit; and the TDC module is configured to output a time parameter of a counting interval in accordance with the action instruction outputted by the operation module.

Optionally, the current or voltage signal obtained by the conversation for the target waveform has a rising edge and a falling edge, and the time parameter of the counting interval outputted by the TDC module is at least a portion of a total time of the rising edge and/or the falling edge.

Optionally, the first sampling circuit is set with a first output threshold, the second sampling circuit is set with a second output threshold, and the first output threshold is less than the second output threshold.

Optionally, the drive circuit further includes: a module for adjusting the first output threshold and the second output threshold, where the module for adjusting the first output threshold and the second output threshold includes adjustable resistors, and the first output threshold and the second output threshold are determined by resistances of the adjustable resistors, and where the adjustable resistors include a first adjustable resistor and a second adjustable resistor.

Optionally, the drive circuit is set with a third threshold and a fourth threshold, and a resistance of the first adjustable resistor is determined based on the third threshold; a resistance of the second adjustable resistor is determined based on the fourth threshold, and where the third threshold is less than the fourth threshold.

Optionally, the drive circuit further includes:

a first switch, where the resistance of the first adjustable resistor is determined based on the third threshold in a case that the first switch is turned on; and a second switch, where the resistance of the second adjustable resistor is based on the fourth threshold in a case that the second switch is turned off.

Optionally, in the case of outputting a third threshold, the drive circuit adjusts the resistance of the first adjustable resistor until the level of the first jumping module jumps, to determine the resistance of the first adjustable resistor; and in the case of outputting a fourth threshold, the drive circuit adjusts the resistance of the second adjustable resistor until the level of the second jumping module jumps, to determine the resistance of the second adjustable resistor.

Optionally, the first jumping module and/or the second jumping module is provided by an even number of inverters an even number of inverters.

Optionally, the resistance of the adjustable resistor of the threshold adjustment module is adjusted in accordance with at least one of the following: power-on calibration, adjustment at a preset time interval, and adaptive adjustment.

Optionally, the operation module includes: an XOR operation unit, configured to output the action instruction in accordance with the output results of the first sampling circuit and the second sampling circuit.

Optionally, the drive circuit further includes: a latching module, configured to latch the time parameter of the counting interval outputted by the TDC module in accordance with the action instruction outputted by the operation module.

In a second aspect, a drive method performed by the drive circuit described in the first aspect is provided in the present disclosure. The method includes:

converting, by the target waveform conversion portion, the target waveform information into the current or voltage signal;

outputting the current or voltage signal obtained by conversion to the first sampling circuit and the second sampling circuit;

outputting, by the operation module, the action instruction in accordance with the output results of the first sampling circuit and the second sampling circuit; and outputting, the TDC module, the time parameter of the counting interval in accordance with the action instruction outputted by the operation module.

Optionally, the current or voltage signal obtained by the conversation for the target waveform has a rising edge and a falling edge, and the time parameter of the counting interval outputted by the TDC module is at least a portion of a total time of the rising edge and/or the falling edge.

Optionally, the first sampling circuit is set with a first output threshold, the second sampling circuit is set with a second output threshold, and the first output threshold is less than the second output threshold.

Optionally, the operation module is provided by an XOR operation unit to output the action instruction in accordance with the output results of the first sampling circuit and the second sampling circuit.

Optionally, a module for adjusting the first output threshold and the second output threshold is further provided, and the module for adjusting the first output threshold and the second output threshold includes adjustable resistors, and the first output threshold and the second output threshold are determined by resistances of the adjustable resistors, and where the adjustable resistors include a first adjustable resistor and a second adjustable resistor.

Optionally, a third threshold and a fourth threshold are set, and a resistance of the first adjustable resistor is determined based on the third threshold; a resistance of the second adjustable resistor is determined based on the fourth threshold, and where the third threshold is less than the fourth threshold.

Optionally, a first switch and a second switch are provided, the resistance of the first adjustable resistor is determined based on the third threshold in a case that the first switch is turned on, and the resistance of the second adjustable resistor is based on the fourth threshold in a case that the second switch is turned off.

Optionally, a latching module is further provided to latch the time parameter of the counting interval outputted by the TDC module in accordance with the action instruction outputted by the operation module.

The present disclosure has the following beneficial effects. The drive circuit according to the embodiment of the present disclosure includes a target waveform conversion portion, an operation module and a TDC module. The target waveform conversion portion is configured to convert target waveform information into a current or voltage signal, where the current or voltage signal obtained by conversion is outputted to a first sampling circuit and a second sampling circuit. The operation module is configured to output an action instruction in accordance with output results of the first sampling circuit and the second sampling circuit. The TDC module is configured to output a time parameter of a counting interval in accordance with the action instruction outputted by the operation module. With the solution provided in the present disclosure, the target waveform is converted into the voltage or current signal, and the voltage or current signal converted by the target waveform is processed by two sampling circuits, and a time value of the counting interval is obtained based on the processing result. Compared with the conventional circuit, no reference or reference signal is used, and no comparator is used, ensuring the simplicity, the efficiency and the realization of the circuit.

BRIEF DESCRIPTION OF THE DRAWINGS

In order to illustrate technical solutions of embodiments of the present disclosure more clearly, the drawings used for the embodiments are briefly introduced in the following. It should be understood that the drawings show only some embodiments of the present disclosure, and should not be regarded as a limitation of the scope. Other drawings may be obtained by those skilled in the art from these drawings without any creative work.

DETAILED DESCRIPTION OF EMBODIMENTS

In order to make objects, technical solutions and advantages of the embodiments of the present disclosure clearer, the technical solutions in the embodiments of the present disclosure are clearly and completely described below with reference to the drawings in the embodiments of the present disclosure. Apparently, the described embodiments are some but not all embodiments of the present disclosure.

Figure 1:
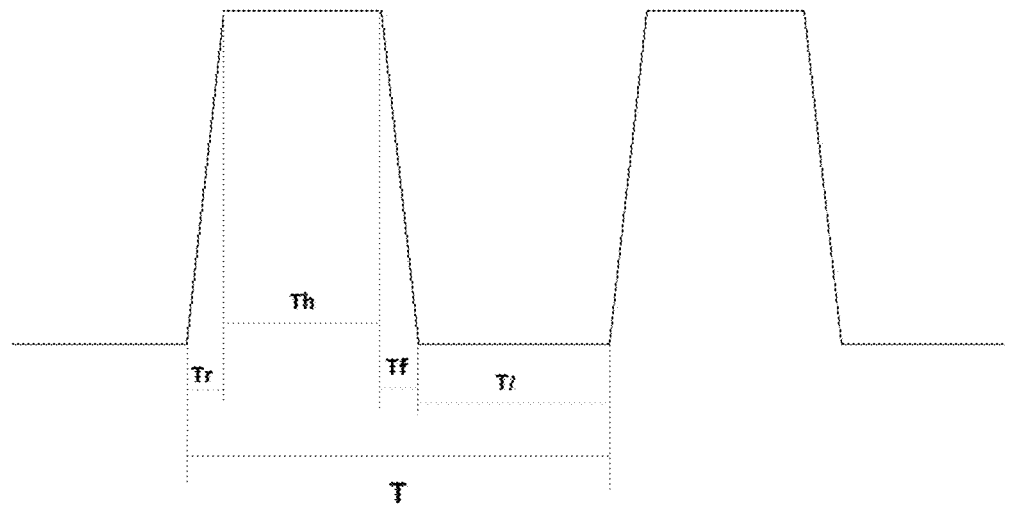
FIG. 1 is a schematic diagram showing a typical pulse waveform in the conventional technology.

FIG. 1 is a schematic diagram showing a typical pulse waveform in the conventional technology, in which T denotes a pulse cycle, Tr denotes a rising time, Th denotes a high retention time, TF denotes a falling time, and Tl denotes a low retention time. In this case, the pulse cycle is expressed as T=Tr+Th+Tf+Tl. If a trigger level of an input pulse is used to measure the different times of the input pulse, has a typical time measurement system having a low-cost test device may detect a rising edge and a falling edge of the input pulse. For example, in the case of the input trigger level of 1V, the measurement system with the input pulse of 0.1V (corresponding to the voltage level at the 10% of 1V) and an amplitude of 0.9V (the voltage level corresponding to the 90% of 1V) may be used to measure the rising time (Tr) and the falling time (Tf) of the input pulse, which are not limited thereto. The two thresholds may be set as 15% and 85%, or 20% and 80%. In order to ensure that the TDC running time is sufficient to obtain a high accuracy, and further in order to minimize the TDC running time to ensure a low power consumption of the circuit, 20% and 80% are preferably determined as the set threshold. The results of the rising and falling edges in a solution with the current as the sampling data are similar to those in the solution with the voltage as the data, and the specific implementation thereof is not limited herein.

Figure 2:
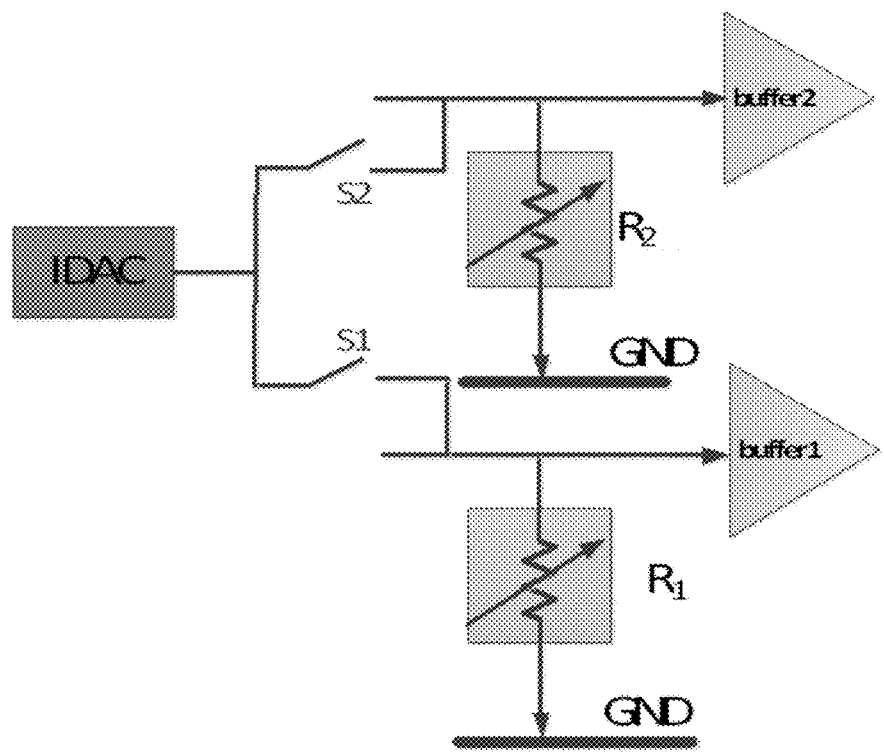
FIG. 2 is a schematic diagram showing a drive circuit according to an embodiment of the present disclosure.

FIG. 2 is a schematic diagram showing a drive circuit according to an embodiment of the present disclosure. Reference is made to FIG. 2, which shows a structure of the drive circuit according to the embodiment of the present disclosure. In an implementation provided in the present disclosure, a system for active laser source detection is driven as an example, where a waveform is required to meet an optical light waveform requirement, which can be implemented by a waveform conversion module. For example, a power requirement for the laser drive operation is obtained based on the waveform requirement, and the power requirement is converted into a current requirement. The following description is given by taking a converted microcurrent waveform as an example, which is not limited to the current in the actual implementation, and the voltage may also be used. The solution of the current as an example herein has the effect of easy to achieve. For example, a current mirror may be used to divide the same current into several different paths, achieving mirror copy of the current signal. Further, due to this, directly using the mirrored current can be achieved without converting an additional resistance into a voltage, simplifying the circuit structure. In addition, the duplication of multiple paths of currents provides the premise of setting different thresholds for the currents of different circuits, instead of traditional complex solutions such as the use of ramp comparison signals or comparators. The current herein has two paths, for example, respectively 20% of the target current and 80% of the target current. A resistance of a resistor R1 in a first circuit is set in such a way that a jumping module jumps at 20% of the highest current value, where the jumping module may be provided by an even number of inverters. An IDAC firstly outputs 20% of the target current as a first current threshold. Next, a switch S1 is turned on, and the value of the adjustable resistor R1 is adjusted so that the value of R1 at a time when the output of a buffer 1 jumps is the value used in the subsequent waveform calibration and determination. Similarly, the IDAC outputs 80% of the target current as a second current threshold, and a switch S2 is turned on and the value of the adjustable resistor R2 is adjusted so that the value of R2 at a time when the output of a buffer 2 jumps is the value used in the subsequent waveform calibration and determination, where the jump module is provided by an even number of inverters. The above gives an example of the implementation and does not limit the specific module implementation. The two jump modules are denoted as the buffer 1 and the buffer 2 in FIG. 1.

Figure 3:
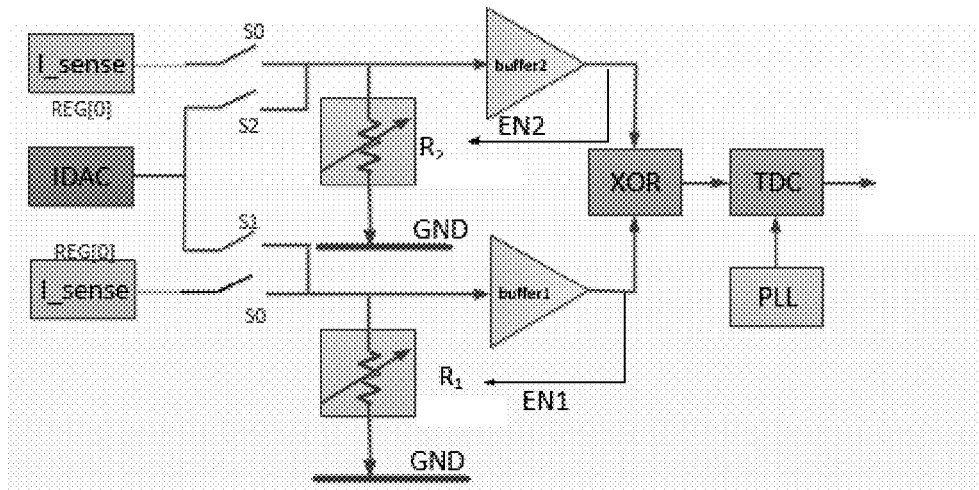
FIG. 3 is a schematic structural diagram showing a drive circuit according to another embodiment of the present disclosure.

FIG. 3 is a schematic structural diagram showing a drive circuit according to another embodiment of the present disclosure. A current Itarget corresponding to a target optical power is obtained by APC calibration, and 0.2 Itarget and 0.8 Itarget are calculated according to the Itarget. Firstly, the resistance of the adjustable resistor is adjusted. The following descrption is given by taking 80% and 20% as an example. A switch S1 is turned on, and the IDAC is adjusted to 0.2 Itarget/1000 (in the circuit design, the gain from Isense to Itarget is designed to be 1000), and the resistance of the resistor R1 is adjusted (from small to large). When the output of the buffer 1 jumps from a low level to a high level, the adjustment for the R1 is stopped through the EN1, and the current output value of the R1 is maintained. Similarly, the switch S1 is turned off and the switch S2 is turned on, the IDAC is adjusted to 0.8 Itarget/1000, and the resistance of the resistor R2 is adjusted (from small to large). When the output of the buffer 2 jumps from a low level to a high level, the adjustment for the R2 is stopped through the EN2, and the current output value of the R2 is maintained. By the above adjustment process, confirmation of the resistance of the adjustable resistor is achieved under a low current, ensuring less energy consumption of the whole adjustment process, and rationalizing power consumption of the whole drive module. After the resistance of the variable resistor is fixed, the circuit may operate as follows. The S2 is turned off and the S0 is turned on, the Sensor drives the laser by a LVDS Driver chip. When the sampling current rises to 0.2 Itarget/1000, the output of the buffer 1 jumps from the low level to the high level, the XOR outputs a high level, and the TDC is activated to start the counting, where the current time is recorded as t0. When the sampling current rises to 0.8 Itarget/1000, the output of the buffer 2 jumps from the low level to the high level, and the output of the XOR jumps to the low level, where the current time is recorded as t1. At this time, data of the counter is latched into a register. Similarly, for the falling edge, when the current first falls to 0.8 Itarget/1000, the buffer 2 outputs the low level, the XOR outputs the high level, where the current time is recorded as t2. When the current falls to 0.2 Itarget/1000, the buffer 1 outputs the low level, the XOR outputs the low level, where the current time is recorded as t3. At this time, the TDC is stopped, and the counting result is latched into the register. The following description is given in terms of a drive solution in a drive chip. The above thresholds are not limited to 20% and 80%. Further, the threshold correction may be performed in different time periods. For example, the power-on calibration is performed before the power on, or the correction is performed in a fixed time period or in a random time period in the operation of the device, or the adaptive correction is performed in the use of the process, for example, the adaptive correction is performed in a gap between interval times in the use of the drive power supply, which is not limited herein.

Figure 4:
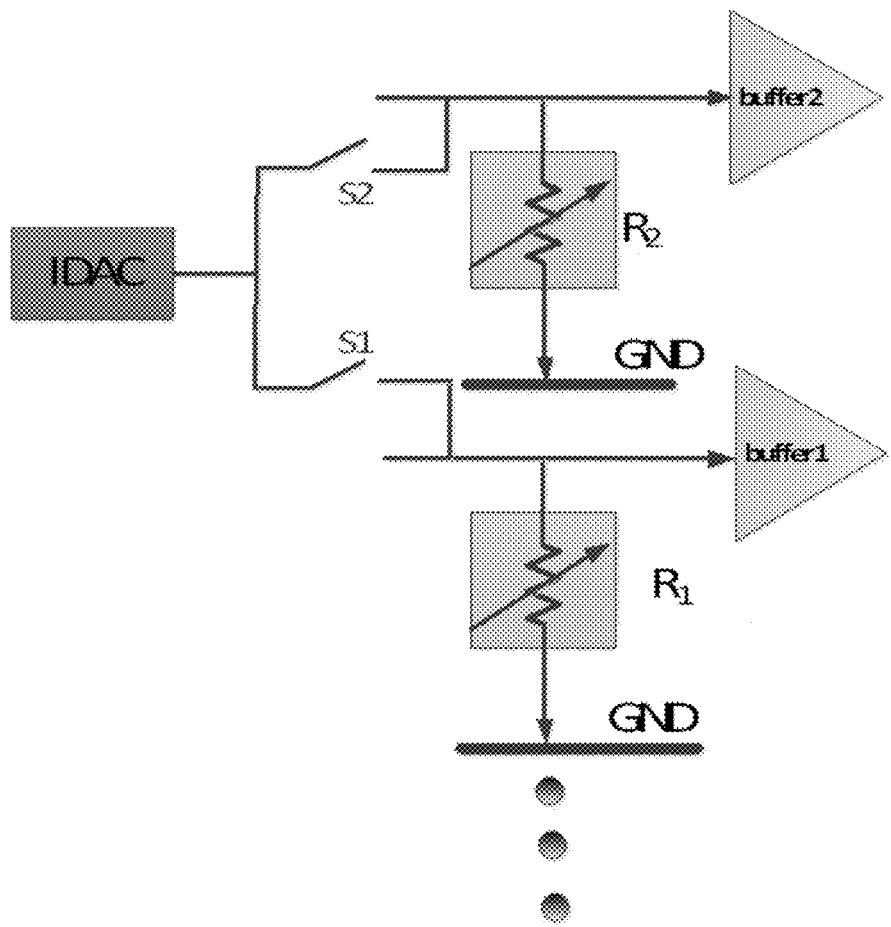
FIG. 4 is a schematic diagram showing a drive circuit provided in the present disclosure.

FIG. 4 is a schematic diagram showing a drive circuit provided in the present disclosure, which differs from the embodiment shown in FIG. 2 in that, the adjustable resistors are not limited to 2 paths in this embodiment, and may be N paths, where N is greater than or equal to 1. This embodiment is an extended case of the embodiment provided in FIG. 2, and the principle of determining each adjustable resistor is the same as that provided in the embodiment shown in FIG. 2, which is not repeated herein.

Figure 5:
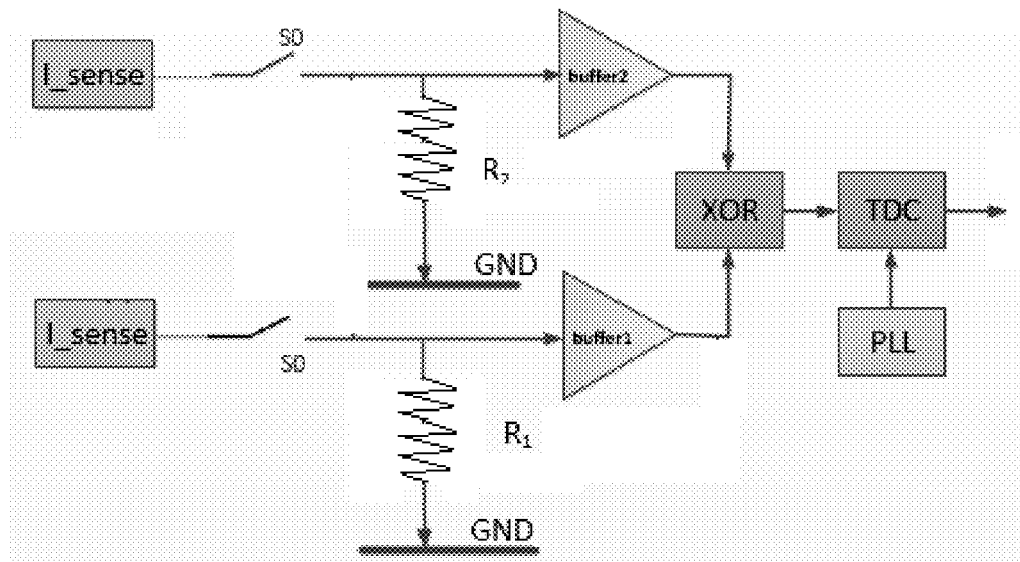
FIG. 5 is a schematic structural diagram showing a drive circuit according to an embodiment of the present disclosure.

FIG. 5 is a schematic structural diagram showing a drive circuit according to an embodiment of the present disclosure. In an implementation provided in the present disclosure, a system for active laser source detection is driven as an example, where a waveform is required to meet an optical light waveform requirement, which can be implemented by a waveform conversion module. For example, a power requirement for the laser drive operation is obtained based on the waveform requirement, and the power requirement is converted into a current requirement. The following description is given by taking a converted microcurrent waveform as an example, which is not limited to the current in the actual implementation, and the voltage may also be used. The solution of the current as an example herein has the effect of easy to achieve. For example, a current mirror may be used to divide the same current into several different paths, achieving mirror copy of the current signal. Further, due to this, directly using the mirrored current can be achieved without converting an additional resistance into a voltage, simplifying the circuit structure. In addition, the duplication of multiple paths of currents provides the premise of setting different thresholds for the currents of different circuits, instead of traditional complex solutions such as the use of ramp comparison signals or comparators. Referring to FIG. 1, the current herein has two paths, and the thresholds for the paths are defined by the resistors of the two paths, for example, respectively 20% and 80%. The resistance of the resistor R1 in the first circuit is set in such a way that the jumping module jumps at 20% of the highest current value, where the jumping module may be provided by an even number of inverters. The resistance of the resistor R2 in the second circuit is set in such a way that the jumping module jumps at 80% of the highest current value, where the jumping module may be provided by an even number of inverters. The above gives an example of the implementation and does not limit the specific module implementation. The two jump modules are denoted as the buffer 1 and the buffer 2 in FIG. 1. The operation is performed on the results of the two jump modules by an arithmetic unit, i.e., the XOR exclusive OR operation module in the FIG. 1. The operation module may output the action instruction under different thresholds of the two circuits. The TDC may start or end the timing in accordance with the action instruction, and latch the result of the timing. Optionally, for a traditional trapezoidal waveform, the time of the rising edge and/or the falling edge may be acquired by the counting result of the TDC. In order to ensure the accuracy of timing, it is required to ensure the precision of the TDC timing. For example, in the solution provided in the present disclosure, the timing operation may be performed by a 50 picosecond level timer, and may also be performed by other similar picosecond-level counters to ensure the timing accuracy, which is not limited herein. With the action instruction of the operation module, the running time of the TDC with the picosecond-level precision can be ensured, further ensuring that the entire circuit does not have large power consumption due to the long working time of the high-precision TDC.

Figure 6:
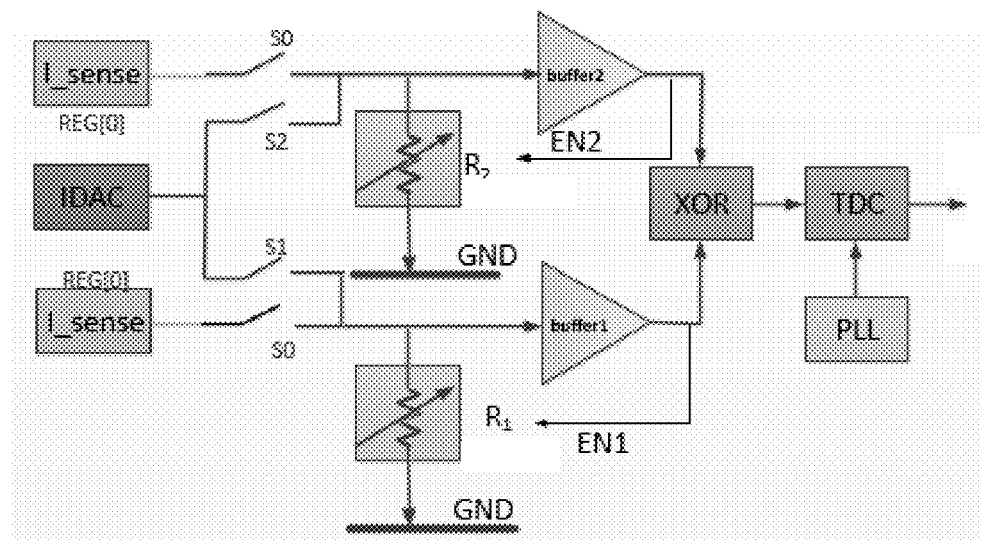
FIG. 6 is a schematic structural diagram showing a drive circuit according to another embodiment of the present disclosure.

FIG. 6 is a schematic structural diagram showing a drive circuit according to another embodiment of the present disclosure, which differs from the embodiment shown in FIG. 2 in that, an adaptive threshold setting is added in this embodiment. The threshold may be adjusted through the use of variable resistors, so that different action instructions can be obtained based on the adjusted threshold, to perform adaptive adjustment for the scene. Similar to the waveform generation mechanism in FIG. 2, a current Itarget corresponding to a target optical power is obtained by APC calibration, and 0.2 Itarget and 0.8 Itarget are calculated according to the Itarget. Firstly, the resistance of the adjustable resistor is adjusted. The following description is given by taking 80% and 20% as an example. A switch S1 is turned on, and the IDAC is adjusted to 0.2 Itarget/1000 (in the circuit design, the gain from Isense to Itarget is designed to be 1000), and the resistance of the resistor R1 is adjusted (from small to large). When the output of the buffer 1 jumps from a low level to a high level, the adjustment for the R1 is stopped through the EN1, and the current output value of the R1 is maintained. Similarly, the switch S1 is turned off and the switch S2 is turned on, the IDAC is adjusted to 0.8 Itarget/1000, and the resistance of the resistor R2 is adjusted (from small to large). When the output of the buffer 2 jumps from a low level to a high level, the adjustment for the R2 is stopped through the EN2, and the current output value of the R2 is maintained. By the above adjustment process, confirmation of the resistance of the adjustable resistor is achieved under a low current, ensuring less energy consumption of the whole adjustment process, and rationalizing power consumption of the whole drive module. After the resistance of the variable resistor is fixed, the circuit may operate as follows. The S2 is turned off and the S0 is turned on, the Sensor drives the laser by a LVDS Driver chip. When the sampling current rises to 0.2 Itarget/1000, the output of the buffer 1 jumps from the low level to the high level, the XOR outputs a high level, and the TDC is activated to start the counting, where the current time is recorded as t0. When the sampling current rises to 0.8 Itarget/1000, the output of the buffer 2 jumps from the low level to the high level, and the output of the XOR jumps to the low level, where the current time is recorded as t1. At this time, data of the counter is latched into a register. Similarly, for the falling edge, when the current first falls to 0.8 Itarget/1000, the buffer 2 outputs the low level, the XOR outputs the high level, where the current time is recorded as t2. When the current falls to 0.2 Itarget/1000, the buffer 1 outputs the low level, the XOR outputs the low level, where the current time is recorded as t3. At this time, the TDC is stopped, and the counting result is latched into the register, which is similar to that in FIG. 2. The following description is given in terms of a drive solution in a drive chip. The above thresholds are not limited to 20% and 80%. Further, the threshold correction may be performed in different time periods. For example, the power-on calibration is performed before the power on, or the correction is performed in a fixed time period or in a random time period in the operation of the device, or the adaptive correction is performed in the use of the process, for example, the adaptive correction is performed in a gap between interval times in the use of the drive power supply, which is not limited herein.

Figure 7:
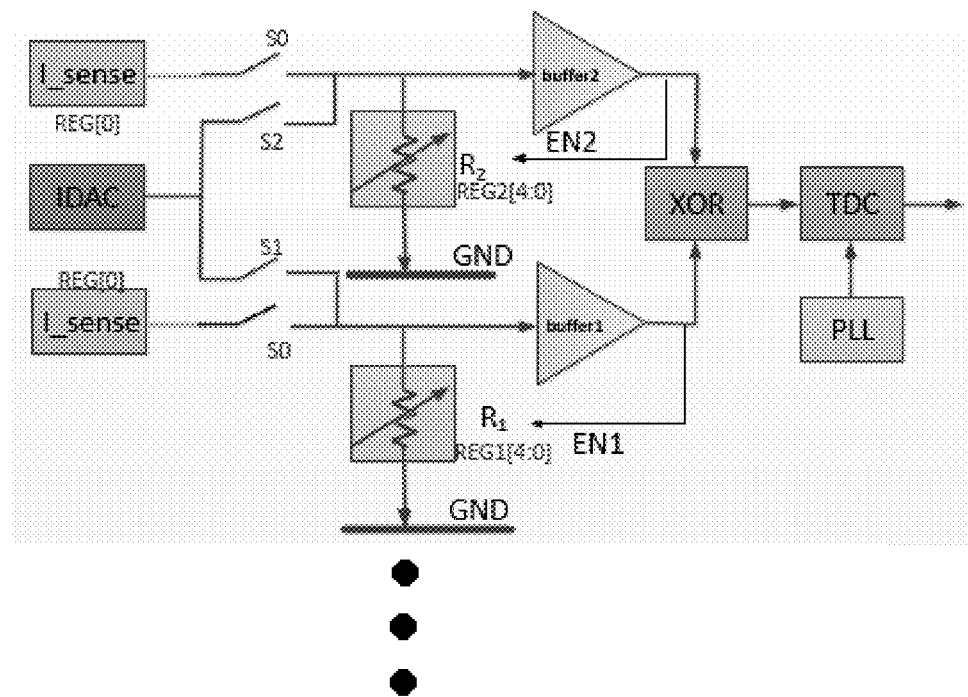
FIG. 7 is a schematic structural diagram showing a drive circuit according to another embodiment of the present disclosure.

FIG. 7 is a schematic structural diagram showing a drive circuit according to another embodiment of the present disclosure, which has the same working principle as the embodiments shown in FIG. 2 and FIG. 3, and are not described in detail herein. It should be noted that, the current herein may be divided into more than two paths by the current mirror, so as to adaptively drive emission of a special waveform of a non-traditional waveform and calibration adjustment in the process. For example. for a sine wave, multiple correction points may be set at the half wave or ¼ wave, such as 3, 4, 5, 6 or more correction points, to realize the precise correction for the drive current, so that the driver chip outputs accurate drive energy, to achieve the efficient and accurate drive of the drive circuit. In a specific implementation, the exclusive OR operation may be performed for two points, to determine the relative interval time between the two points, where the exclusive OR operation is performed for which two points is not limited herein.

Figure 8:
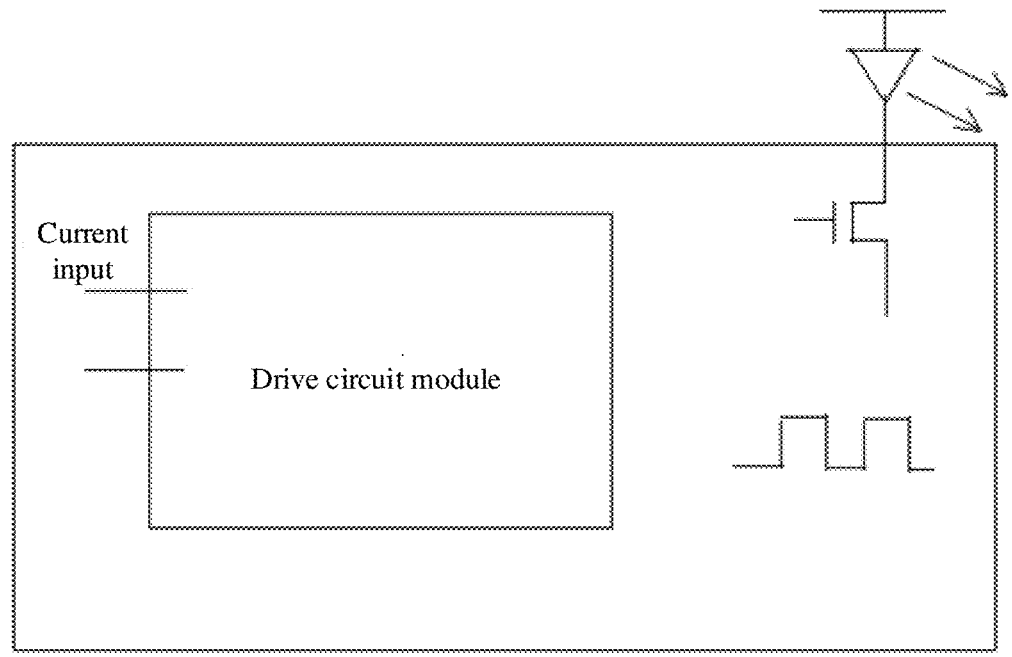
FIG. 8 is a schematic diagram showing chip modularity according to an embodiment of the present disclosure.

FIG. 8 is a schematic diagram showing chip modularity according to an embodiment of the present disclosure. The laser source is optimally selected as a diode type light source, for example, may be a vertical cavity surface diode emitter VCSEL. The drive module is required to output accurate drive power in accordance with the power, the optical waveform and so on. For example, for a traditional trapezoidal pulse waveform, accurate acquisition of the rising edge time and the falling edge time of the waveform is critical. For example, the APC calibration described with reference to FIG. 3 is performed to obtain a demanded current corresponding to the target waveform, and an actual current is supplied to the driver circuit module in the form of feedback. In this way, the entire driver chip has the function of automatic calibration of the emitted light, so that no separate external sampling device is needed in the system to accurately locate the rising edge time and the falling edge time of the converted current, ensuring that the emitted waveform of the laser source driven by the entire driver chip is accurate all the time.

Figure 9:
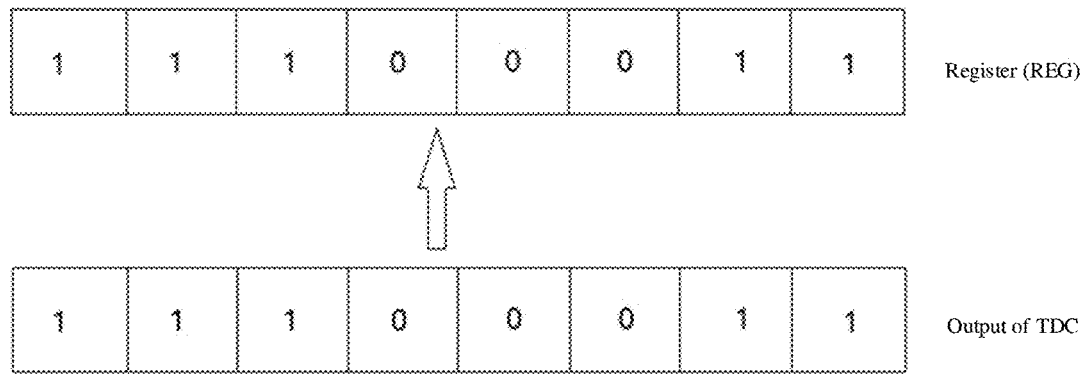
FIG. 9 is a schematic diagram showing storage of time information obtained by a TDC according to an embodiment of the present disclosure.

FIG. 9 is a schematic diagram showing storage of time information obtained by a TDC according to an embodiment of the present disclosure. After the TDC detects the rising or falling edge or other wave calibration time period information, the detected result is required to be stored. The following description is given by taking a register REG connected with the TDC as an example. For example, the output of the TDC has 8 bits. When outputting the rising edge time, the TDC outputs a converted 8-bit binary code segment, and the register receives an 8-bit memory code segment. Optionally, the register may contain an identification information segment, which is not limited herein. For example, based on the information result obtained in FIG. 3, the accurate rising and falling edge times can be obtained in accordance with $Tr=t1-t0$, $Tf=t3-t2$, $T=t2-t0$.

Figure 10:
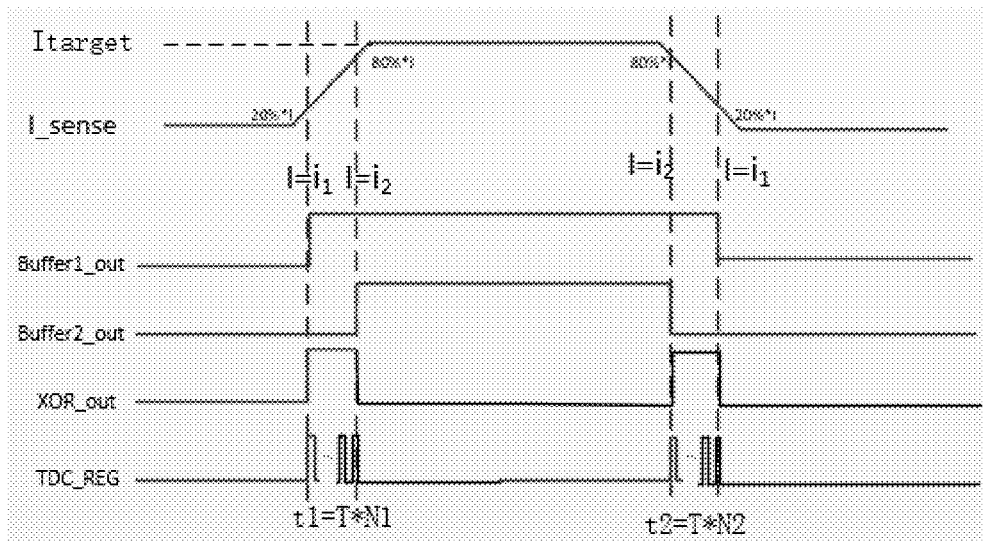
FIG. 10 is a schematic diagram showing implementation of a circuit operation according to an embodiment of the present disclosure.

FIG. 10 is a schematic diagram showing implementation of a circuit operation according to an embodiment of the present disclosure. A current Itarget corresponding to a target optical power is obtained by APC calibration, that is, the target light waveform is converted into a demanded current. The threshold setting of the two sampling circuits is achieved by the adjustment for resistances of the variable resistors. The target waveform contains a rising edge phase and a falling edge phase. In order to accurately drive the light emitting unit to output a correct waveform, it is required to accurately obtain the rising and falling edge times. When the first sampling circuit reaches the threshold thereof, the jump module 1 buffer 1 outputs a high level, at this time the second threshold has not yet been reached. In this case, the result of the exclusive-OR operation of the arithmetic unit is true, and the subsequent circuit begins to operate, that is, the TDC begins to count. With the increase in time, the second sampling circuit reaches the threshold thereof. At this time, a false value result of 0 is obtained by the exclusive-OR operation of the arithmetic unit, and the counter stops operating. In this way, the rising edge time is obtained. The falling edge time may be obtained in a similar manner as the rising edge time, which is not repeated in detail herein.

Figure 11:
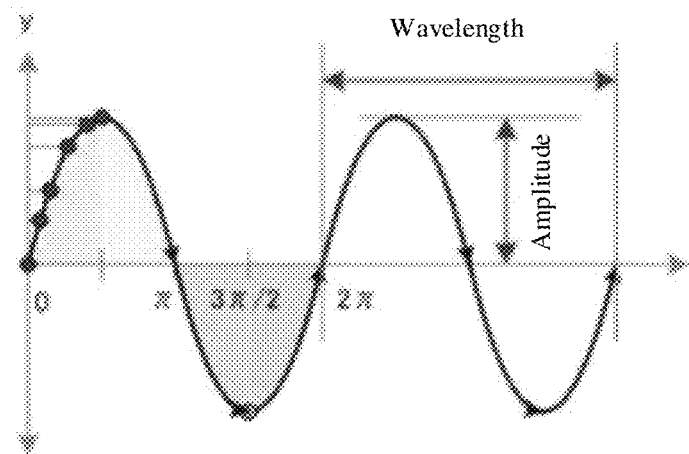
FIG. 11 is a schematic diagram showing implementation of sine wave drive according to an embodiment of the present disclosure.

FIG. 11 is a schematic diagram showing implementation of sine wave drive according to an embodiment of the present disclosure. The following description is given by taking the case of setting six sampling points in the ¼ wavelength range as an example. Since the 0 point is generally not calibrated, the sampling is actually performed on 5 points. The replication of multiple paths of signal is achieved by the use of a current mirror or similar devices, and multiple relative time information is determined by the exclusive-OR operation for any two paths. The calibration of the driver can be completed by the obtained time information. Further, 5 or more sampling points may be set in the half-wave cycle to complete the calibration, which is not limited herein.

Figure 12:
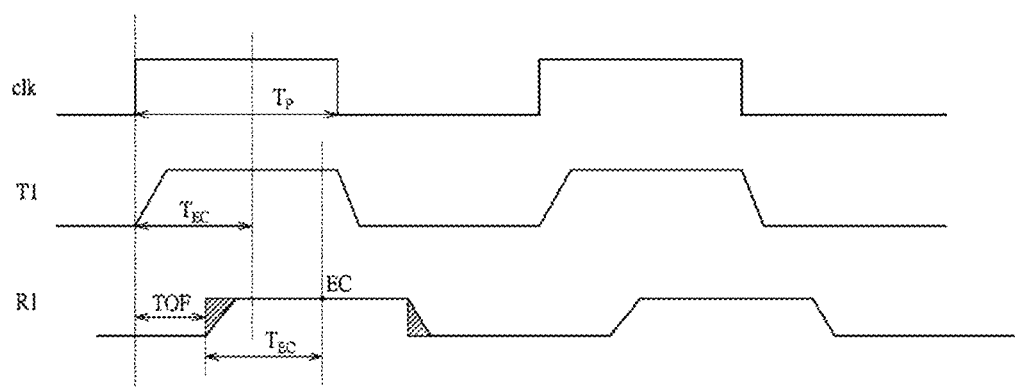
FIG. 12 is a schematic diagram showing that a rising edge time and a falling edge time are accurately acquired to correct distance measurement accuracy in the TOF distance measurement according to an embodiment of the present disclosure.

FIG. 12 is a schematic diagram showing that a rising edge time and a falling edge time are accurately acquired to correct distance measurement accuracy in the TOF distance measurement according to an embodiment of the present disclosure. In the distance measurement process, the measured distance may have a certain error due to the uncertainty of the rising edge or the falling edge. Therefore, in the case of high-precision detection, the accurate rising edge and/or falling edge time is obtained by using similar principles of the present disclosure to complete the calibration of accurate detection, which is also an application of the present disclosure, and the acquisition principle is not described in detail herein.

It should be noted that, relational terms such as "first" and "second" herein are only used to distinguish one entity or operation from another entity or operation, and do not necessarily require or imply there is such actual relationship or sequence between these entities or operations. Moreover, terms "comprising", "including" or any other variations thereof are intended to encompass a non-exclusive inclusion, such that a process, a method, an article or a device including a series of elements includes not only those elements, but also includes other elements that are not explicitly listed or inherent to such the process, method, article or device. Without further limitation, an element defined by a phrase "including a . . . " does not preclude the presence of additional identical elements in a process, method, article or device including the element.

Preferred embodiments of the present disclosure are given in the above description, and are not intended to limit the present disclosure. For those skilled in the art, the present disclosure may have various modifications and changes. Any modifications, equivalents and improvements made in the spirit and principle of the present disclosure should be included in the protection scope of the present disclosure. It should be noted that similar numerals and letters refer to similar items in the following drawings. Therefore, if an item is defined in a drawing, the item is not required to be further defined and explained in subsequent drawings. Preferred embodiments of the present disclosure are given in the above description, and are not intended to limit the present disclosure. For those skilled in the art, the present disclosure may have various modifications and changes. Any modifications, equivalents and improvements made in the spirit and principle of the present disclosure should be included in the protection scope of the present disclosure.

The invention claimed is:

1. A drive circuit, comprising:
   a target waveform conversion portion, configured to convert target waveform information into a current or voltage signal, wherein the current or voltage signal obtained by conversion is outputted to a first sampling circuit and a second sampling circuit;
   an operation module, configured to output an action instruction in accordance with output results of the first sampling circuit and the second sampling circuit; and
   a TDC module, configured to output a time parameter of a counting interval in accordance with the action instruction outputted by the operation module.

2. The drive circuit according to claim 1, wherein the current or voltage signal obtained by the conversation for the target waveform has a rising edge and a falling edge, and the time parameter of the counting interval outputted by the TDC module is at least a portion of a total time of the rising edge and/or the falling edge.

3. The drive circuit according to claim 1, wherein the first sampling circuit is set with a first output threshold, the second sampling circuit is set with a second output threshold, and the first output threshold is less than the second output threshold.

4. The drive circuit according to claim 3, wherein the operation module comprises:
   a first jumping module, wherein a level of the first jumping module jumps when the first sampling circuit reaches the first output threshold; and
   a second jumping module, wherein a level of the second jumping module jumps when the second sampling circuit reaches the second output threshold.

5. The drive circuit according to claim 4, wherein the first jumping module and/or the second jumping module is provided by an even number of inverters.

6. The drive circuit according to claim 3, further comprising:
   a module for adjusting the first output threshold and the second output threshold, wherein the module for adjusting the first output threshold and the second output threshold comprises adjustable resistors, and the first output threshold and the second output threshold are determined by resistances of the adjustable resistors, and wherein the adjustable resistors comprise a first adjustable resistor and a second adjustable resistor.

7. The drive circuit according to claim 6, wherein the drive circuit is set with a third threshold and a fourth threshold, and a resistance of the first adjustable resistor is determined based on the third threshold; a resistance of the second adjustable resistor is determined based on the fourth threshold, and wherein the third threshold is less than the fourth threshold.

8. The drive circuit according to claim 7, further comprising:
   a first switch, wherein the resistance of the first adjustable resistor is determined based on the third threshold in a case that the first switch is turned on; and
   a second switch, wherein the resistance of the second adjustable resistor is based on the fourth threshold in a case that the second switch is turned off.

9. The drive circuit according to claim 6, wherein
   in the case of outputting a third threshold, the drive circuit adjusts the resistance of the first adjustable resistor until the level of the first jumping module jumps, to determine the resistance of the first adjustable resistor; and
   in the case of outputting a fourth threshold, the drive circuit adjusts the resistance of the second adjustable resistor until the level of the second jumping module jumps, to determine the resistance of the second adjustable resistor.

10. The drive circuit according to claim 6, wherein the resistance of the adjustable resistor of the threshold adjustment module is adjusted in accordance with at least one of the following:
    power-on calibration, adjustment at a preset time interval, and adaptive adjustment.

11. The drive circuit according to claim 1, wherein the operation module comprises:
    an XOR operation unit, configured to output the action instruction in accordance with the output results of the first sampling circuit and the second sampling circuit.

12. The drive circuit according to claim 1, further comprising:
    a latching module, configured to latch the time parameter of the counting interval outputted by the TDC module in accordance with the action instruction outputted by the operation module.

13. A drive method performed by the drive circuit according to claim 1, the method comprising:
    converting, by the target waveform conversion portion, the target waveform information into the current or voltage signal;
    outputting the current or voltage signal obtained by conversion to the first sampling circuit and the second sampling circuit;
    outputting, by the operation module, the action instruction in accordance with the output results of the first sampling circuit and the second sampling circuit; and
    outputting, the TDC module, the time parameter of the counting interval in accordance with the action instruction outputted by the operation module.

14. The drive method according to claim 13, wherein the current or voltage signal obtained by the conversation for the target waveform has a rising edge and a falling edge, and the time parameter of the counting interval outputted by the TDC module is at least a portion of a total time of the rising edge and/or the falling edge.

15. The drive method according to claim 13, wherein the first sampling circuit is set with a first output threshold, the second sampling circuit is set with a second output threshold, and the first output threshold is less than the second output threshold.

16. The drive method according to claim 15, wherein a module for adjusting the first output threshold and the second output threshold is further provided, and the module for adjusting the first output threshold and the second output threshold comprises adjustable resistors, and the first output threshold and the second output threshold are determined by resistances of the adjustable resistors, and wherein the adjustable resistors comprise a first adjustable resistor and a second adjustable resistor.

17. The drive method according to claim 16, wherein a third threshold and a fourth threshold are set, and a resistance of the first adjustable resistor is determined based on the third threshold; a resistance of the second adjustable resistor is determined based on the fourth threshold, and wherein the third threshold is less than the fourth threshold.

18. The drive method according to claim 13, wherein the operation module is provided by an XOR operation unit to output the action instruction in accordance with the output results of the first sampling circuit and the second sampling circuit.

19. The drive method according to claim 17, wherein a first switch and a second switch are provided, the resistance of the first adjustable resistor is determined based on the third threshold in a case that the first switch is turned on, and the resistance of the second adjustable resistor is based on the fourth threshold in a case that the second switch is turned off.

20. The drive method according to claim 13, wherein a latching module is further provided to latch the time parameter of the counting interval outputted by the TDC module in accordance with the action instruction outputted by the operation module.

* * * * *